PROCESS FOR MAKING SEMICONDUCTOR DEVICES

Filed Sept. 15, 1959 2 Sheets-Sheet 1

WITNESSES:
Bernard R. Gieguez
James F. Young

INVENTORS
Harold F. John and
John W. Faust, Jr.
BY
Frederick Shapoe
ATTORNEY

United States Patent Office 3,075,892
Patented Jan. 29, 1963

3,075,892
PROCESS FOR MAKING SEMICONDUCTOR DEVICES

Harold F. John, Wilkinsburg, and John W. Faust, Jr., Forest Hills, Pa., assignors to Westinghouse Electric Corporation, East Pittsburgh, Pa., a corporation of Pennsylvania Filed Sept. 15, 1959, Ser. No. 840,045
16 Claims. (Cl. 204—15)

This invention relates to a process for establishing semiconductor transition regions within, and affixing good electrical contacts to, a body of semiconductor material.

In the past, alloyed semiconductor transition regions and electrical contacts have been made within and affixed to a body of semiconductor material by either the alloy fusion technique or the vapor deposition technique, or a combination of both.

While both these techniques have found wide acceptance in the industry, there are certain disadvantages inherent in each. For example, the alloy fusion technique requires a plurality of shaping, cleaning, and handling operations for the doping pellets, foils and the like which are employed. The wetting characteristics of the alloy or metal pellets present problems resulting in erratic or non-uniform doping and bonding. The correct positioning of the pellets and foils also presents difficulties. The alloy pellet process does not lend itself readily to an automatic production process. On the other hand, the vapor deposition process must be carried out in a good vacuum, requires the use of masking, is markedly affected by traces of impurities, has limits as to which materials may be employed, and in general does not lend itself readily to an automatic production process.

An object of the present invention is to provide a new and improved process which readily lends itself to automatic production techniques for affixing electrical contacts, both ohmic and doping, to a body of a semiconductor material comprising treating a predetermined portion of at least one surface of said body to enable selective plating of a metal on the treated portion only, plating at least one layer of at least one suitable metal upon said treated portion, and fusing said deposited metal into said body of semiconductor material.

A further object of the invention is to provide for abrading a plurality of portions of an elongated body of semiconductor material to enable selective deposition of a metal on only the abraded portions and applying an ohmic contact to the deposited metal on said portions.

Other objects of the present invention will, in part, be obvious and will, in part, appear hereinafter.

For a better understanding of the nature and objects of the present invention, reference should be had to the following detailed description and drawings in which:

FIG. 1 is a side view, partially in cross-section and partially schematic, showing a body of a semiconductor material being abraded in accordance with the teachings of this invention;

FIGS. 2 to 6 inclusive are curves comprising graphical presentations of the relationship of certain parameters involved in the practicing of the teachings of this invention;

Figures 1, 2, 3, 4, 5, 6, 7:
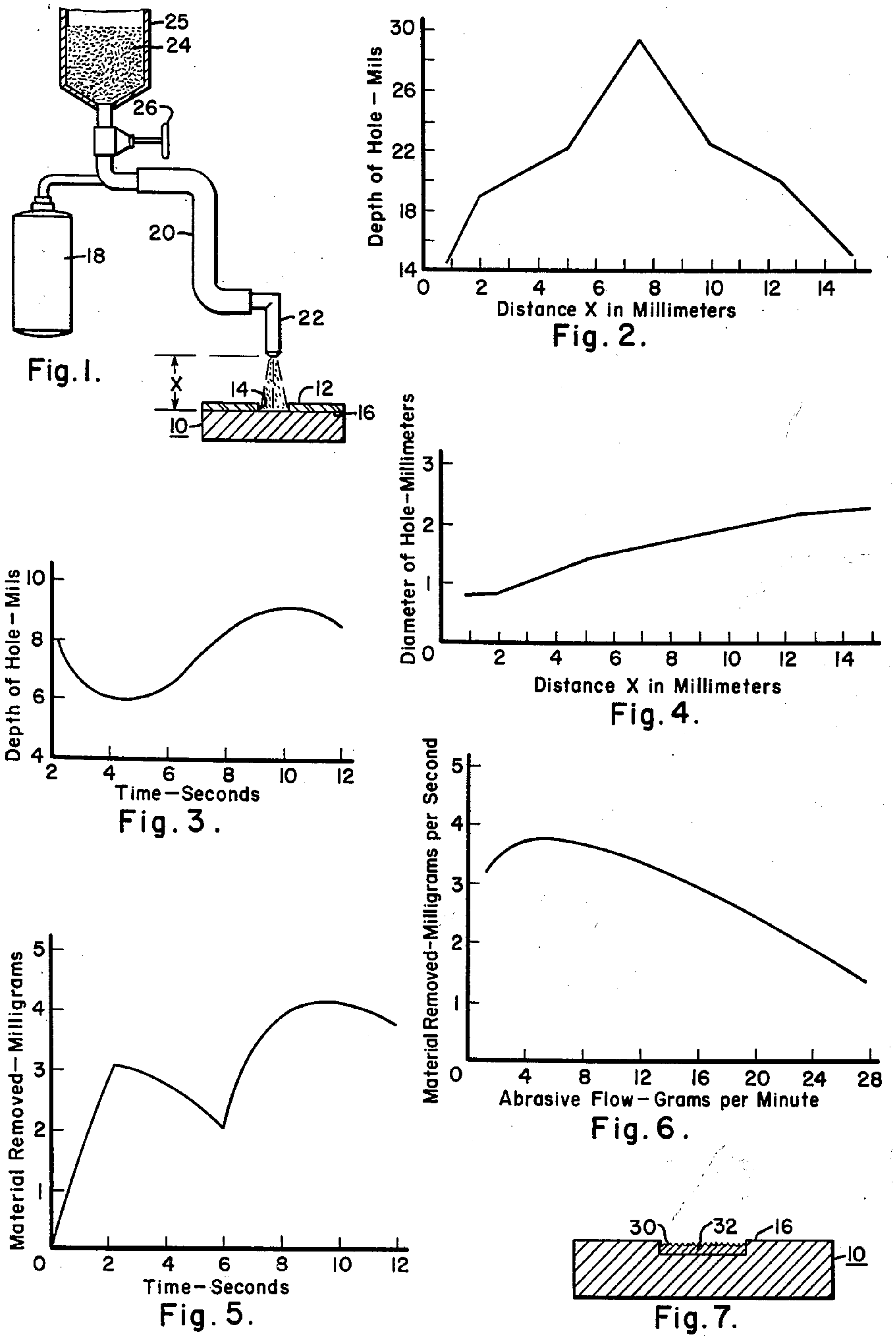
FIG. 7 is a side view, in cross-section, of a semiconductor body abraded in accordance with the teaching of this invention.

In accordance with the present invention and in attainment of the foregoing objects, there is provided a process for affixing electrical contacts to a body of a semiconductor material comprising, abrading a predetermined portion of at least one surface of said body, plating at least one layer of at least one suitable metal upon said abraded portion, and fusing said deposited metal into said body of semiconductor material.

In general in practicing the teachings of this invention, a predetermined portion of at least one surface of a body of a semiconductor material selected from the group consisting of silicon, germanium, and compounds comprised of elements of group III and group V of the periodic table is selectively abraded to produce a mechanically roughened portion upon the surface or surfaces. The abraded portion has been found to be preferentially platable with metal by chemical or electrochemical processes. The non-abraded portions do not acquire metal deposits, or at most non-adherent, readily removable films of metal may be deposited thereon, as compared to adherent thick metal deposits on the abraded portions.

The abrading may be accomplished by any of the methods known to those skilled in the art, for example, (1) by directing a jet of a liquid containing an abrasive against the predetermined portion of the surface of the semiconductor body; (2) by ultrasonic vibration of a liquid medium having an abrasive dispersed therein; (3) by the use of an abrasive or cutting wheel; (4) by the use of a drill such as is used in dental work, having an abrasive embeded in a face which is brought into contact with the semiconductor body; (5) by handlapping; (6) by directing a jet of a gas containing an abrasive, in finely divided particle form against the area to be abraded. The last method has been found to be particularly satisfactory in practicing the teachings of this invention. Examples of suitable gases which may be used as a carrier for the abrasive include argon, nitrogen, dry air and the like.

Examples of suitable abrasives which may be used in particle form in practicing this invention include alumina, silicon carbide, silicon, germanium, diamond dust and the like.

After abrading, one or more layers of metal are applied to the abraded area by any one or more of the following: (1) electro-plating; (2) displacement plating; and (3) chemical reduction in solution. Methods (2) and (3) are sometimes referred to as electroless or electrodeless deposition. The preferred or most suitable method of depositing the layers of metal or metals will depend on the particular semiconductor material and the metal to be deposited. This practice is discussed more fully hereinafter.

After deposition of the metal layers, the assembly may be provided with leads or contacts on the metal layers and the assembly is passed into a furnace and the metal or metals fused with the semiconductor material. Such fusion may result in diffusion of a doping metal into the semiconductor to produce p-n junctions or doped layers, and to bond the leads or contact to the selected portions.

More specifically, and with reference to FIG. 1, there is illustrated a body 10 of a semiconductor which may, for example, be selected from the group consisting of silicon, germanium and III–V compounds and having a first type of semiconductivity being abraded in accordance with the teachings of this invention. A mask 12, with an aperture 14 therein, has been disposed on a surface 16 of the body 10. The mask 12 may be comprised of a metal, a cured resin, rubber, a ceramic or the like. A gas, for example, argon, from a source 18, for example, a commercial tank or cylinder, is carried through a hose 20 to a nozzle 22. An abrasive 24, for example, alumina, is metered into the gas stream in the hose 20 from a tank 25 by a valve means 26. The abrasive is entrained with and propelled by the gas within the hose 20. The gas stream, with the abrasive entrained therein, passes through the nozzle 22 and impinges upon that portion of surface 16 exposed through the aperture 14 of the mask 12. The exposed portion of surface 16 is abraded by the gas-abrasive jet.

The amount or depth of abrading achieved may be readily calculated and controlled by a judicious selection of certain parameters. These parameters are: (1) The type and particle size of the abrasive, (2) the amount of abrasive applied, (3) abrading time, (4) gas pressure, (5) the distance from the nozzle tip to the abraded surface (denoted by X in FIG. 1), and (6) the semiconductor material involved. Curves showing the relationship of some of these parameters are shown graphically in FIGS. 2 to 6 inclusive, using alumina having an average particle size of 22.5 microns as the abrasive and argon as the carrier gas. The argon gas was at a cylinder pressure of 50 p.s.i. The semiconductor material was germanium. Under identical conditions about ⅓ less silicon by volume is removed than germanium because of the difference in hardness between them.

Good results have been achieved in practicing this invention when the semiconductor body has been abraded to a depth of from approximately ½ mil to one mil. Using argon gas, as a pressure of 50 p.s.i. (the pressure may vary considerably without much difference in the results), and alumina having an average particle size of 400 mesh (U.S. Stand. Sieve) and smaller, and having an "X" distance of from ½ to one inch, this may be produced in a few seconds.

Figure 8:
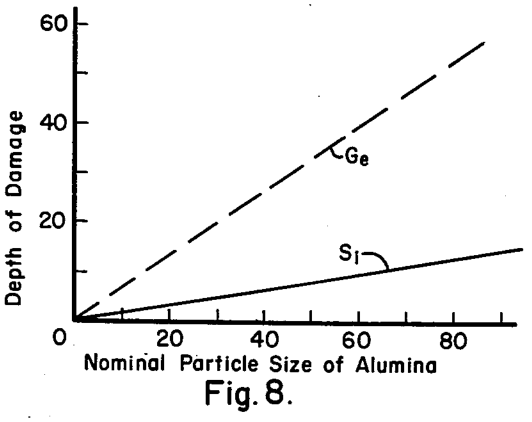
FIG. 8 is a graphical representation of the relationship between particle size of the abrasive and depth of damage of an abraded layer in a body of semiconductor material.

With reference to FIG. 7, there is illustrated an enlarged cross-sectional view of the wafer 10 of FIG. 1 after abrading, the mask being removed. Surface 16 of wafer 10 has an abraded area 30, and there is a damaged layer 32 in which the perfection of the crystal structure has been disturbed, immediately below the abraded area 30. The depth of the damaged layer 32 is dependent upon the abrasive used, its particle size and the semiconductor material being abraded. This relationship is shown graphically in FIG. 8 for varying alumina particles for silicon and germanium. The relationship shown in FIG. 8 is based on tests comprising abrading by handlapping. The damaged layer is of controlled depth and is not undesirable, and in fact, may be desirable.

A layer or layers of a metal or metals is now deposited on the abraded area 30 by either electroplating or by an electroless process or by a combination of both.

Figure 9:
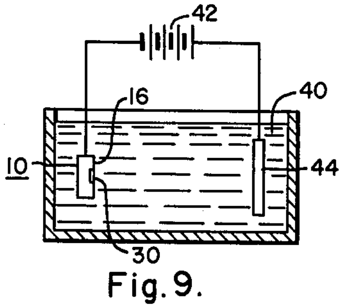
FIG. 9 is a side view in partial cross-section of an abraded body of semiconductor material being processed in accordance with the teachings of this invention.

With reference to FIG. 9, if the metal layer is to be applied by electroplating, the body 10 of semiconductor material is immersed in an electrolytic bath 40 comprised of a salt of the metal or metals to be deposited. The body 10 is biased negatively by a power source 42 relative to an anode 44. The anode 44 is comprised of an inert conductive material or of the metal or metals to be deposited on the abraded portion 30 of surface 16 of the body 10. Metal ions from the electrolytic bath 40 and the anode 44 are preferentially deposited on the abraded portion 30 of surface 16 of the body 10. For some reason, using most standard plating solutions and plating conditions, very little or no metal deposits from the solutions on the untreated surface portions of the semiconductor.

The selectivity of the plating on the abraded regions will be readily controlled by adjusting the plating voltage and current, and the concentration of the plating bath. Also the plating current, time and concentration of the plating bath will control the amount of metal it is desired to deposit on the abraded portion 30 of the surface 16 of the body 10. Electrolytic plating processes are well known and need not be detailed extensively herein. A metal layer such as gold may be deposited substantially only on the abraded portion of surface of body by one of the electroless processes by a suitable adjustment of the bath and its temperature. Satisfactory doping and ohmic contact areas have been prepared from a layer of a doping material having a thickness of from 0.1 to 10 mils.

Electroless deposition is achieved by one of two essentially different processes: (1) the oxidation and displacement of the semiconductor material atoms by more noble metal atoms, or (2) the reduction of metal ions to metal atoms by means of another oxidizable ion in solution with the semiconductor surface acting only as a place of deposition, or possibly, in some cases, also as a catalyst.

In the case of a displacement reaction, a metal layer forms preferentially on the abraded region with a continuous build-up of metal.

In the case of a displacement reaction, for example, with germanium, positive ions necessary to continue the metal deposition can be taken into solution either from the unabraded portion or through tiny pin-point cells in the metal coating (local anodic cells). Electrons will be transferred through the semiconductor body to the metal-plated region where reduction is occurring. The resistance of the base semiconductor is important in the movement of electrons from the unplated regions. The resistance can be decreased by illumination or by heating.

It should be understood, that both electroplating and electroless deposition can be used sequentially to deposit one or more layers of one or more metals on a given abraded region.

When employing either of the electroless processes the plating time is dependent upon the deposition rate of the metal and upon the desired thickness of the metal coating. Satisfactory results have been achieved in forming junctions within a semiconductor body from metal coatings having a thickness of as little as 0.1 mil. A necessary condition for most p-n junction fabrication by the techniques described herein is that the plated metal layer or layers be of sufficient thickness that when molten, at the selected alloying temperature, it will dissolve enough of the underlying semiconductor wafer to penetrate through the damaged layer resulting from abrading. If the depth of damage is known, the minimum thickness of metal, for a given fabrication temperature can be calculated from phase diagrams of known or readily determined metal-semiconductor systems.

Exceptions to the above procedure relating to the complete penetration of the damaged layer applications are where fast switching times are desired, as for example, in computer devices. In such devices, it is often necessary to sacrifice peak inverse voltage and a low saturation current for fast switching time. A fast switching time implies a low lifetime region in the semiconductor body adjacent to the p-n junction. The techniques described herein are in many cases adaptable to producing fast-switching devices. For example, after abrading the selected regions, to produce a given depth of damaged layer, as described above and below, a small thickness of metal is selectively electroplated onto the abraded regions. If the amount of plated metal is limited such that when heated to the selected fabrication temperature, it will dissolve only a portion of the damaged layer semiconductor, the remaining portion of the damaged semiconductor region will serve as a low-lifetime region. A fast switching-time device will result.

Satisfactory ohmic contacts have been established with even less than 0.1 mil of plated metal. In many cases it will not be necessary to have enough ohmic metal to dissolve all of the underlying damaged layer. In the case of both the doping metal and the ohmic metal, the maximum thickness may be many mils and will be determined by design considerations or by plating limitations.

The selection of a suitable plating or immersion bath is dependent upon the semiconductor material involved and of course upon the metal it is desired to plate. Examples of metals and metal systems which can be used to plate selectively onto abraded regions are set forth in tabular form below. The examples are illustrative and should not be considered as excluding the use of other baths and processes to deposit other metals.

junction 64 being formed between zones 60 and 62, and a layer 66 comprised of the recrystallized metal from layer 50 which was not included in the lattice structure of the semiconductor material during recrystallization. If the layer 50 of FIG. 10 was comprised of a doping material and a contact material, for example, antimony and gold the layer 66 will be comprised predominately of the neutral material, i.e., gold.

It will be understood that if the process is employed only to affix an ohmic contact material to the body 10 the fusion step may not be necessary, though it is usually desirable.

TABLE

| Semiconductor Material | Metal Layer Deposited | Bath Composition | Process | Type of Contact |
|---|---|---|---|---|
| N-type Ge | Indium | Acidic $InCl_3$ or acidic $In_2(SO_4)_3$ or basic $In(CN)_3$. | Electroplating | P-N junction. |
| | Silver | Dilute (1%–5%) $AgNO_3$ | Electroless (displacement) | Ohmic. |
| | Copper | Dilute (1%–5%) $Cu(NO_3)_2$ or $CuSO_4$ | do | Do. |
| | Copper (1st coat) plus indium (2nd coat). | Dilute (1%–5%) $Cu(NO_3)_2$ or $CuSO_4$ | do | P-N junction. |
| | | Acidic $InCl_3$ or acidic $In_2(SO_4)_3$ or basic $In(CN)_3$. | Electroplating | Do. |
| | Gold | $KAu(CN)_2$, KOH | Electroless (displacement) | Ohmic. |
| | | $AuCl_3$, HCl | Electroplating | Do. |
| | Gold (1st coat) | $KAu(CN)_2$, KOH | Electroless (displacement) | P-N junction. |
| | plus | $AuCl_3$, HCl | Electroplating | Do. |
| | Indium (2nd coat) | Acidic $InCl_3$ or acidic $In_2(SO_4)_3$ or basic $In(CN)_3$. | do | Do. |
| P-type Ge | Silver | Dilute (1%–5%) $AgNO_3$ | Electroless (displacement) | Ohmic. |
| | Gold | $KAu(CN)_2$, KOH | do | Do. |
| | | $AuCl_3$, HCl | Electroplating | Do. |
| | Copper | Dilute (1%–5%) $Cu(NO_3)_2$ or $CuSO_4$ | Electroless (displacement) | Do. |
| | Silver, gold or copper (1st coat) | do | | |
| | plus Lead (2nd coat) | $Pb(NO_3)_2$ | Electroplating | Do. |
| | Lead | $Pb(NO_3)_2$ | | Do. |
| | Silver, gold or copper (1st coat) | $Pb(NO_3)_2$ | | |
| | plus Lead (2nd coat) | $Pb(NO_3)_2$ | | |
| | plus Antimony (3rd coat) | Acidic $SbCl_3$ | Electroplating, electroless (displacement). | P-N Junction. |
| | Gold (1st coat) | do | | Do. |
| | plus Antimony (2nd coat) | do | | Do. |
| | Gold-antimony alloy | Either acidic solutions of $AuCl_3$ or basic solutions of $KAu(CN)_2$. | Electroplating | Do. |
| P-type Si | Gold | $KAu(CN)_2$, KOH | Electroless (displacement) with heat and illumination. | Ohmic. |
| | Gold plus antimony | $KAu(CN)_2$, KCN, $K_2CO_3$, $K_2HPO_4$, $SbCl_3$. | Electroless | P-N Junction. |
| | Gold (1st coat) | $KAu(CN)_2$, KOH | Electroless heat and illumination | Do. |
| | plus Antimony (2nd coat) | Acidic $SbCl_3$ | Electroless (displacement), electroplating. | |
| N-type Si | Aluminum | $AlCl_3$, $(C_2H_5)_2O$, $C_4H_9NH_2$ | Electroplating in an inert atmosphere or possibly electroless position. | Do. |
| | Gold | $KAu(CN)_2$, KOH | Electroless (displacement) with heat and illumination. | Ohmic. |
| | Gold (1st coat) | $KAu(CN)_2$, KOH | do | P-N Junction. |
| | plus Thallium (2nd coat) | $TlClO_4$, $HClO_4$ | Electroplating | |

It should be noted from the above table that both doping metals and ohmic contact metals can be deposited on the abraded area either sequentially or together. It may also sometimes be convenient to add a doping impurity to a carrier metal, electroplated as described above, by evaporation, ionic beam, or by pick-up from a gaseous atmosphere.

Figure 10:
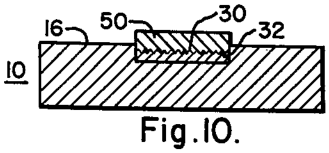
FIGS. 10 and 11 are side views in cross-section of a body of semiconductor material being processed in accordance with the teachings of this invention.

After the deposition of the metal layer, the body 10 of semiconductor material has the configuration and composition shown in FIG. 10. The body 10 has at least one metal layer 50 disposed over the abraded surface 30.

Figure 11:
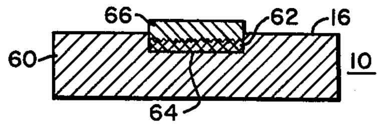

The body is then charged into a furnace and the metal layer 50 and body 10 heated to temperature sufficient to melt the metal, for example, when body 10 is silicon, a temperature of from 600° C. to 1000° C. and, when the body 10 is germanium, a temperature of from 400° C. to 600° C. The deposited metal melts and dissolves some of the body of semiconductor material. The body is then cooled, whereby, the dissolved semiconductor recrystallizes with some of the metal within its lattice structure thus forming a zone of a second type of semiconductivity within the body 10. The resultant structure is illustrated in FIG. 11, and is comprised of the body 10 having a zone of first-type (or original) semiconductivity 60, a zone 62 of second-type semiconductivity, a p-n It will be further understood, that while the invention was described in terms of preparing a single p-n junction device, it is equally applicable to preparing multi-junction devices, for example, p-n-p, p-n-p-n, devices and devices having intrinsic regions therein—such as p-i-n and n-p-i-n.

This invention lends itself exceptionally well to the processing of semiconductor materials grown as elongated dendritic crystals as set forth in U.S. patent applications Serial No. 757,832, filed August 28, 1958, and now abandoned, and Serial No. 829,069, filed July 23, 1959, the assignee of both of which is the same as the assignee of the present invention.

Figure 12:
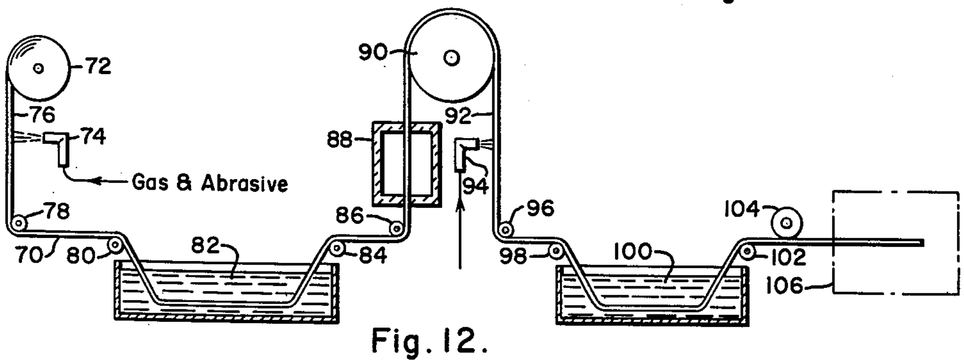
FIG. 12 is a schematic diagram of a dendritic crystal being processed in accordance with the teachings of this invention.

With reference to FIG. 12, there is a schematic diagram of one method of fabricating a continuous length of an elongated dendrite into semiconductor devices. The dendrite 70, consisting of a semiconductor material selected from the group consisting of silicon, germanium and group III–V compounds, having a first-type of semiconductivity is unwound from a spool 72 and passes before a first abrading nozzle 74. An abrasive jet comprised of, for example, an inert gas such as nitrogen and alumina particles are emitted from the nozzle 74. The discharge from the nozzle 74 is synchronized with the speed of the dendrite so that surface 76 of the dendrite 70 is abraded at predetermined intervals, for example, every 10 mils to 1 inch. Rollers 78 and 80 are employed to pass the dendrite 70 through a first metal depositing bath 82, whereby a layer of a metal, for example, a doping metal such as indium is deposited upon the abraded portions of surface 76. By the employment of rollers 84 and 86 the dendrite 70 is then passed through a fusion furnace 88, whereby the metal deposited by bath 82 is fused to the dendrite 70. The dendrite 70 then passes over roller 90 and surface 92 of the dendrite 70 is abraded by nozzle 94 in the same manner as surface 76 of the dendrite 70 was abraded by nozzle 74. After passing over rollers 96 and 98, the dendrite 70 is passed through a second metal plating bath 100, whereby an ohmic contact metal such as gold is plated upon the abraded portions of surface 92 of the dendrite 70. By the use of rollers 102 and 104, the dendrite is then passed on to region 106, where lead attachment and other operations can be performed before individual complete semiconductor devices are separated from the heretofore continuous strip.

It will be understood that the above description relative to FIG. 12 is only illustrative and not to be considered as the only method of handling continuous dendrites.

If it is desired to fabricate a small length of a dendrite in accordance with the teachings of the invention, the strip of dendrite may be fitted with a mask, for example, a metal mask, so that only predetermined areas are abraded.

Masking can also be used with continuous strips in order to give localized abrasion, but in many cases is unnecessary if a properly designed nozzle is used.

In a modification of the teachings of this invention, a surface of a semiconductor body to be processed is first covered with an oxide, for example, by heating a body of silicon to an elevated temperature of a few hundred degrees centigrade in air or by passing through an oxidizing solution. The oxide coating is then removed from a predetermined portion to which a metal is to be plated, by abrading or by the use of suitable solvents, for example, hydrofluoric acid for silicon or germanium, or an organic complexing agent such as d-tartaric acid for germanium.

The abraded regions produced when the oxide layer, as well as the surface of the underlying semiconductor body, is removed, can be used to obtain selective plating of metals in the processes set forth above. However, the presence of an oxide layer may be beneficial in some cases, for confining the plating more selectively to the desired, i.e. the abraded, regions or making the plating conditions less critical in order to confine the plating to the desired areas. If a solvent is used to remove the oxide, there will, of course, be no abraded surface to achieve selective electroplating; however, the ease of plating onto the lightly-oxidized regions where the original oxide layer has been removed as compared to the heavily-oxidized regions can be used to obtain selective plating onto the desired regions.

The following examples are illustrative of the teachings of this invention:

*Example I*

One surface of a strip of dendritic n-type germanium, having a resistivity of from 0.5 to 1.0 ohm-cm., was selectively abraded using a mask. The mask was comprised of brass and had a series of 0.02 inch apertures spaced 0.06 inch apart.

The abrasive employed was comprised of a stream of nitrogen at a tank pressure of 60 p.s.i. and 400 mesh aluminum oxide. The aluminum oxide was introduced into the nitrogen stream at a rate of about 1.5 grams per minute. The abrasive was directed against the masked dendrite through a nozzle having a discharge orifice of 0.018 inch diameter for 3 seconds from a distance of 1.25 inches.

The abraded dendrite had a linear array of abraded regions 0.02 inch in diameter spaced 0.06 inch apart. The abraded regions were surrounded by the unabraded smooth surface of the dendrite.

The abraded dendrite was washed in distilled water to remove any abrasive dust. The dendrite was then submerged in a plating bath comprised of 7.4 grams $InCl_3$, 4 ml. of a dilute HCl solution comprised of 3 ml. concentrated HCl in 200 ml. of deionized water, and 1000 ml. of deionized water. The dendrite was biased negative relative to a metallic indium anode, and indium was plated on only the abraded portions of the dendrite with a current density of about 20 ma./cm.$^2$ and a voltage of 0.3 v. The plating time was 28 minutes.

The indium plated dendrite was then washed with deionized water and heated at 500° C. for 5 minutes at a pressure of $3\times10^{-3}$ mm. Hg, whereby, the plated indium was fused into the germanium dendrite to form a p-n junction therein. An ohmic contact foil was fused onto the opposite side of the dendrite strip during the fusion of the indium.

The germanium dendrite was then post-etched for 10 seconds in a mixture of 3 parts HF, 1 part $HNO_3$, and 1 part $HC_2H_3O_2$.

Figure 13:
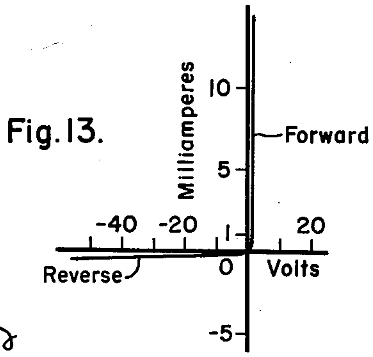
FIG. 13 is a graphical presentation of the I–V characteristic of a diode prepared in accordance with the teachings of this invention.

The I–V characteristics of the device thus produced and are illustrated graphically in FIG. 13. It will be noted from the I–V characteristics that the device thus produced showed good rectification.

*Example II*

The procedure of Example I was repeated except that a plating current density of about 30 ma./cm.$^2$ and a voltage of 0.5 v. was employed.

Due to the difference in plating conditions, a thin film of indium plated onto the unabraded portion of the dendrite in addition to that plated on the abraded portion.

After fusion at 500° C. for 5 minutes, during which time an ohmic contact was fused to the other side of the dendritic strip, the strip was post-etched for 10 seconds with a solution comprised of 3 parts HF, 1 part $HNO_3$ and 1 part $HC_2H_3O_2$. The etching removed the indium that had been plated on the unabraded portion of the dendrite.

The I–V characteristics of the p-n junction were found to be comparable in quality to the device of Example I.

*Example III*

A dendritic strip of n-type germanium was abraded in the same manner as described in Example I to produce a linear array of abraded portions having a diameter of 0.02 inch spaced 0.06 inch apart.

Gold was electrolessly plated onto the abraded portions from a solution containing 10 grams $KAu(CN)_2$, and 200 grams of KOH. The solution being directed to 1 liter with deionized water.

Indium was then selectively electroplated onto the gold from a bath having the composition set forth in Example I. The electroplating was carried out for 60 minutes with a current density of about 15 ma./cm.$^2$ and a voltage of 0.3 v. The plating was quite selective, depositing only on the gold.

The assembly was fused and post-etched as set forth in Example I.

The I–V characteristics of the device were measured and rectification was observed.

*Example IV*

A strip of p-type dendritic germanium was abraded under the same conditions as described in Example I.

Gold was electrolessly plated onto the abraded portions in the manner set forth in Example III.

A gold-antimony alloy was selectively electroplated onto the previously plated gold from a solution comprised of 8.1 grams $KAu(Cn)_2$, 30 grams KCN, 30 grams $K_2CO_3$, 30 grams $K_2HPO_4$, 15 milligrams of $SbCl_3$ dilute to liter with deionized water. The plating time was 10 minutes with a current density of 10 to 50 ma./mc.$^2$ and a voltage of 0.3 to 1.0 volt.

After fusion and post-etching as described in Example I, the I–V characteristics were measured and rectification was observed.

*Example V*

A wafer of p-type silicon was abaraded by the procedure of Example I to produce a linear array of abraded regions 0.02 inch in diameter and spaced 0.06 inch apart across one surface.

The wafer was submerged in a solution consisting of 10 grams $KAu(CN)_2$, 200 grams KOH plus sufficient deionized water to dilute the solution to 1 liter. A sun lamp was used to maintain the solution at a temperature within the range of 70° C. to 90° C. Gold electrolessly plated on the abraded regions. The plating time was 20 minutes.

The wafer was then submerged in a solution comprised of 10 grams $SbCl_3$, 100 ml. HCl plus sufficient deionized water to dilute the solution to 1 liter. Antimony was plated onto the previously plated gold by displacement.

The silicon wafer was charged into a furnace and heated for 5 minutes at 900° C. and at a pressure of $5\times10^{-5}$ mm. Hg, whereby, a p-n junction was formed at each of the abraded regions between the gold-antimony plated metal and the silicon. An ohmic contact was fused to the other surface of the silicon wafer during the fusion.

The silicon wafer was then post-etched with an etchant comprised of 5 parts $HNO_3$ and 1 part HF.

The I–V characteristics were measured, and good rectification was observed.

While the invention has been described with reference to particular embodiments and examples, it will be understood, that modifications, substitutions and the like may be made therein without departing from its scope.

We claim as our invention:

1. A process for treating by plating selective portions only of a body of a semiconductor material having surfaces upon which adherent coatings are not readily platable consisting of, abrading a predetermined portion of at least one surface of said body, depositing by plating at least one adherent layer of at least one suitable contact metal upon only said entire abraded portion without masking any portion of the body, the plating depositing preferentially on the abraded surfaces only and thereafter fusing said deposited metal into said body of semiconductor material.

2. A process for affixing electrical ohmic contacts to a body of a semiconductor material having surfaces upon which adherent coatings are not readily platable consisting of, abrading a predetermined portion of at least one surface of said body, and depositing by plating at least one adherent layer of at least one suitable ohmic contact metal upon only said entire abraded portion without masking any portion of the body, the plating depositing preferentially on the abraded surfaces only of the body of semiconductor material.

3. A process for affixing electrical ohmic contacts to a body of a semiconductor material having surfaces upon which adherent coatings are not readily platable consisting of, abrading a predetermined portion of at least one surface of said body, and depositing by electroplating at least one adherent layer of at least one suitable ohmic contact metal upon only said entrie abraded portion without masking any portion of the body, the plating depositing preferentially on the abraded surfaces only of the body of semiconductor material.

4. A process for affixing electrical ohmic contacts to a body of a semiconductor material having surfaces upon which adherent coatings are not readily platable consisting of, abrading a predetermined portion of at least one surface of said body, and depositing by electroless means at least one adherent layer of at least one suitable ohmic contact metal upon only said entire abraded portion without masking any portion of the body, the plating depositing preferentially on the abraded surfaces only of the body of semiconductor material.

5. A process for establishing a p-n junction within a body of a semiconductor material having surfaces upon which adherent coatings are not readily platable consisting of abrading a predetermined portion of at least one surface of said body, plating at least one adherent layer of at least one suitable doping material upon only said entire abraded portion of said body of semiconductor material without masking any portion of the body, the plating depositing preferentially on the abraded surfaces only, and alloying said adherent metal into said body of semiconductor material to a desired depth, whereby a p-n junction is formed within the body of semiconductor material.

6. A process for establishing a p-n junction within a body of a semiconductor material having surfaces upon which adherent coatings are not readily platable consisting of, abrading a predetermined portion of at least one surface of said body, depositing by electroplaling at least one adherent layer of at least one suitable doping material upon only said entire abraded portion of said body of semiconductor material without masking any portion of the body, the plating depositing preferentially on the abraded surfaces only, and alloying said adherent metal into said body of semiconductor material to form a p-n junction therein.

7. A process for establishing a p-n junction within a body of a semiconductor material having surfaces upon which adherent coatings are not readily platable consisting of, abrading a predetermined portion of at least one surface of said body, depositing by electroless plating at least one adherent layer of at least one suitable doping material upon only said entire abraded portion of said body of semiconductor material without masking any portion of the body, the plating depositing preferentially on the abraded surfaces only, and alloying said adherent metal into said body of semiconductor material to form a p-n junction therein.

8. In the fabrication of a semiconductor device the steps consisting of, abrading a predetermined portion of at least one surface of a body of a semicoductor material having surfaces upon which adherent coatings are not readily platable, plating at least one adherent layer of a suitable doping material upon only said entire abraded portion without masking any portion of the body, the plating depositing preferentially on the abraded surfaces only, plating at least one adherent layer of a suitable ohmic contact metal over only said doping material without masking any portion of the body, and alloying said doping material into said body of semiconductor material to provide a body of semiconductor material having a p-n junction therein and an ohmic contact attached to a region thereof.

9. In the fabrication of a semiconductor device the steps consisting of, abrading a predetermined portion of at least one surface of a body of a semiconductor material having surfaces upon which adherent coatings are not readily platable, electroplating at least one adherent layer of at least one suitable doping material upon only said entire abraded portion without masking any portion of the body, the plating depositing preferentially on the abraded surfaces only, electroplating at least one adherent layer of a suitable ohmic contact metal over only said doping material without masking any portion of the body, and alloying said doping material into said body of semiconductor material to provide a body of semiconductor material having a p-n junction therein and an ohmic contact attached to a region thereof.

10. In the fabrication of a semiconductor device the steps consisting of, abrading a predetermined portion of at least one surface of a body of a semiconductor material having surfaces upon which adherent coatings are not readily platable, plating by electroless means at least one adherent layer of at least one suitable doping material upon only said entire abraded portion without masking any portion of the body, the plating depositing preferentially on the abraded surfaces only, plating by electroless means at least one adherent layer of a suitable ohmic contact metal over only said doping material without masking any portion of the body, and alloying said doping material into said body of semiconductor material to provide a body of semiconductor material having a p-n junction therein and an ohmic contact attached to one region thereof.

11. A process for affixing electrical contacts to a body of a semiconductor material having surfaces upon which adherent coatings are not readily platable consisting of, forming an oxide coating upon at least one surface of said body, removing said oxide coating from a predetermined portion of the surface by abrading, thereafter plating at least one adherent layer of at least one suitable contact metal upon only said entire oxide free abraded portion of the surface, and fusing said deposited contact metal into said body of semiconductor material.

12. A process for affixing electrical contacts to a body of a semiconductor material having surfaces upon which adherent coatings are not readily platable consisting of, forming an oxide coating upon at least one surface of said body, removing said oxide coating from a predetermined portion of the surface by abrading, thereafter electroplating at least one adherent layer of at least one suitable contact metal upon only said entire oxide free abraded portion of the surface, and fusing said deposited contact metal into said body of semiconductor material.

13. A process for affixing electrical contact to a dendritic strip of a semiconductor material of indefinite length having surfaces upon which adherent coatings are not readily platable consisting of, directing an admixture of an inert gas and finely divided particles of an abrading material against the dendritic strip at predetermined intervals along its length, whereby, said strip of dendritic material is abraded at said predetermined intervals, plating at least one adherent layer of at least one contact metal upon only said entire abraded portions without masking any portion of the body, the plating depositing preferentially on the abraded surfaces only, and fusing said metal into said dendritic strip of semiconductor material.

14. A process for establishing at least one p-n junction in a dendritic strip of a semiconductor material of indefinite length having surfaces upon which adherent coatings are not readily platable consisting of, abrading at least one surface of said dendrite at predetermined intervals along its length, electroplating at least one adherent layer of at least one doping material upon only said entire abraded portions of the dendritic strip, and alloying said doping material into said dendritic strip of semiconductor material.

15. A process for establishing at least one p-n junction in a dendritic strip of a semiconductor material of indefinite length having surfaces upon which adherent coatings are not readily platable consisting of, abrading at least one surface of said dendrite at predetermined intervals along its length, plating by electroless means at least one adherent layer of at least one doping material upon only said entire abraded portions of the dendritic strip, and alloying said doping material into said dendritic strip of semiconductor material.

16. In the fabrication of a strip of a dendritic crystal of a semiconductor material of indefinite length into a series of semiconductor devices, the dendrite having surfaces upon which adherent coatings are not readily platable, the steps consisting of, abrading at least one surface of said dendrite at predetermined intervals along its length, plating at least one adherent layer of at least one suitable doping material upon only said entire abraded portions without masking any portion of the body, the plating depositing preferentially on the abraded surfaces only, plating at least one adherent layer of at least one suitable ohmic contact metal over only said doping material, and alloying said doping material into said body of semiconductor material to provide a body of semiconductor material having at least one p-n junction therein, and an ohmic contact attached to one region thereof.

References Cited in the file of this patent

UNITED STATES PATENTS

| | | |
|---|---|---|
| 2,691,736 | Haynes | Oct. 12, 1954 |
| 2,793,420 | Johnston et al. | May 28, 1957 |
| 2,814,589 | Waltz | Nov. 26, 1957 |
| 2,854,387 | Zimmerman | Sept. 30, 1958 |
| 2,935,453 | Saubestre | May 3, 1960 |